(12) United States Patent
McIntyre et al.

(10) Patent No.: US 8,723,323 B2
(45) Date of Patent: May 13, 2014

(54) METHOD FOR FABRICATING SOLDER COLUMNS FOR A COLUMN GRID ARRAY PACKAGE

(75) Inventors: Thomas J. McIntyre, Nokesville, VA (US); Keith K. Sturcken, Nokesville, VA (US); Christy A. Hagerty, Haymarket, VA (US)

(73) Assignee: BAE Systems Information and Electronic Systems Integration Inc., Nashau, NH (US)

( * ) Notice: Subject to any disclaimer, the term of this patent is extended or adjusted under 35 U.S.C. 154(b) by 0 days.

(21) Appl. No.: 13/547,518

(22) Filed: Jul. 12, 2012

(65) Prior Publication Data

US 2014/0015098 A1   Jan. 16, 2014

(51) Int. Cl.
*H01L 23/48* (2006.01)

(52) U.S. Cl.
USPC .... 257/772; 257/703; 257/678; 257/E23.023; 257/E23.012; 257/E23.057

(58) Field of Classification Search
USPC .......... 257/772, 703, 678, 738, 775, E23.023, 257/E23.012, E23.057
See application file for complete search history.

(56) References Cited

U.S. PATENT DOCUMENTS

| | | | |
|---|---|---|---|
| 3,898,541 A * | 8/1975 | Weller | 361/321.3 |
| 4,734,818 A * | 3/1988 | Hernandez et al. | 361/306.2 |
| 5,132,806 A * | 7/1992 | Kitamura et al. | 386/300 |
| 5,404,265 A * | 4/1995 | Moresco et al. | 361/306.1 |
| 6,145,735 A * | 11/2000 | Mallery et al. | 228/254 |
| 6,320,249 B1 * | 11/2001 | Yoon | 257/678 |
| 6,917,113 B2 * | 7/2005 | Farooq et al. | 257/772 |
| 7,348,661 B2 * | 3/2008 | Kim et al. | 257/678 |
| 7,553,696 B2 * | 6/2009 | Bartley et al. | 438/107 |
| 7,944,028 B2 * | 5/2011 | Saunders et al. | 257/666 |
| 8,395,902 B2 * | 3/2013 | Knickerbocker | 361/763 |
| 2002/0179573 A1 * | 12/2002 | Gianchandani et al. | 219/69.11 |
| 2007/0034989 A1 * | 2/2007 | Shioga et al. | 257/532 |

* cited by examiner

*Primary Examiner* — Michael Shingleton
(74) *Attorney, Agent, or Firm* — Yudell Isidore Ng Russell; Antony P. Ng

(57) ABSTRACT

A method for fabricating an electronic device package having a column grid array is disclosed. A column grid array package includes a substrate, an integrated circuit located on a first side of the substrate, and a set of solder columns located on a second side of the substrate. The column grid array package also includes multiple two-tab electronic devices located on the second side of the substrate. The heights of the two-tab electronic devices are substantially identical to the heights of the solder columns.

16 Claims, 2 Drawing Sheets

METHOD FOR FABRICATING SOLDER COLUMNS FOR A COLUMN GRID ARRAY PACKAGE

BACKGROUND OF THE INVENTION

1. Technical Field

The present invention relates to an integrated circuit device packages in general, and in particular to a method for fabricating solder columns for a column grid array package.

2. Description of Related Art

An integrated circuit (IC) device package may have an IC chip bonded to one side of a substrate and an array of metal connectors extending from the opposite side of the substrate. Two well-known IC device packages are ball grid array (BGA) packages and column grid array (CGA) packages.

BGA packages utilize an array of solder balls as metal connectors, and are typically employed by relatively low-performance chip applications. On the other hand, CGA packages utilize an array of solder columns as metal connectors. The solder columns of CGA packages have less tin content than the solder balls in BGA packages, which provide a more compliant and flexible pin connection points that can withstand large temperature or mechanical fluctuations. As such, CGA packages are typically employed by relatively high-performance chip applications.

The present disclosure provides an improved method for fabricating solder columns for CGA packages.

SUMMARY OF THE INVENTION

In accordance with a preferred embodiment of the present invention, a column grid array package includes a substrate, an integrated circuit located on a first side of the substrate, and a set of solder columns located on a second side of the substrate. The column grid array package also includes multiple two-tab electronic devices located on the second side of the substrate. The heights of the two-tab electronic devices are substantially identical to the heights of the solder columns.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

For a noise suppression standpoint, it is beneficial to place a large number of capacitors as close as possible to various integrated circuit (IC) devices located on a printed circuit board (PCB). The capacitors help minimizing electrical noise from the IC devices as well as noise in power supplies and ground planes. The capacitors also prevent rail collapses or voltage drops across an IC device's power supply that would cause the IC device to malfunction.

In order to maintain an optimized electrical environment for an IC device having a large number of electrical connectors, capacitors can be placed inside the IC device package and/or on a PCB on which the IC device package is placed. However, these capacitors may take up a large amount of space within the IC device package and/or the PCB on which the IC device package is placed. While some of the capacitors can be placed directly across a power supply to an IC device and the ground return, such connections may introduce a significant amount of connection inductance between the power supply and the capacitors. The large amount of connection inductance can drastically reduce the effectiveness of the capacitors when the operating speeds of the IC device exceed 500 MHz.

In order to provide noise reduction while without increasing package density and connection inductance, in accordance with a preferred embodiment of the present invention, a set of capacitors can be placed directly in parallel or in-line with solder columns of a column grid array (CGA) package. Each capacitor should have approximately the equivalent cross-sectional area of a solder column of the CGA package.

Figure 1:
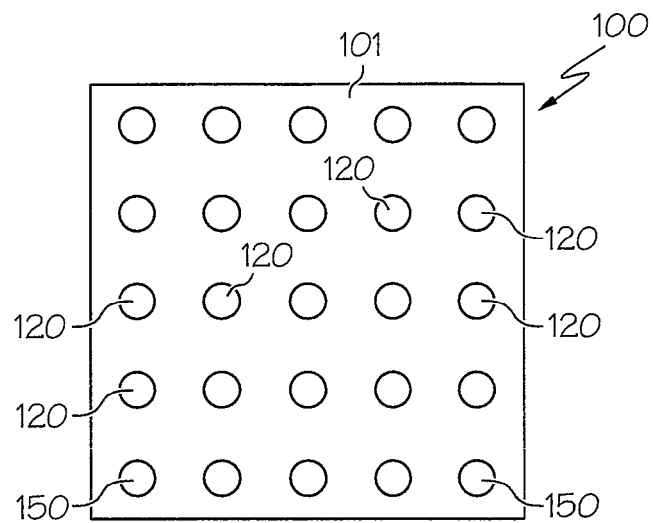
FIG. 1 is a diagram showing a bottom view of a column grid array package, in accordance with a preferred embodiment of the present invention.

Referring now to the drawings and in particular to FIG. 1, there is illustrated a bottom view of a CGA package, in accordance with a preferred embodiment of the present invention. As shown, a CGA package 100 includes an array of solder columns 120 arranged on one side of a substrate 101. An IC chip (not shown) can be bonded to the opposite side of substrate 101. Electrical connections to the IC chip can be formed through substrate 101 to various contact pads (not shown) on the opposite side of substrate 101, and solder columns 120 can be attached to the contact pads. Substrate 101 can be made of, for example, ceramic or silicon.

CGA package 100 also includes several capacitors 150 located on the same side of solder columns 120. Basically, capacitors 150 have occupied the locations that would have been occupied by solder columns 120 on substrate 101.

Figure 2:
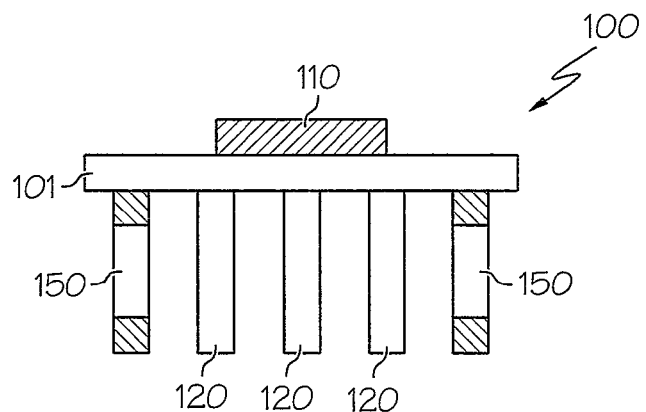
FIG. 2 is a diagram of a side view of the column grid array package from FIG. 1, in accordance with a preferred embodiment of the present invention.

With reference now to FIG. 2, there is illustrated a side view of CGA package 100, in accordance with a preferred embodiment of the present invention. As shown, CGA package 100 includes an IC chip 110 located on the top side of substrate 101, and multiple solder columns 120 located on the bottom side of substrate 101. Preferably made of solder, solder columns 120 vary from 0.050 inch to 0.100 inch in height. The height provides compliancy that allow solder columns 120 to flex during thermal expansion rather than fracture as ball grid array solder balls will do when exposed to continuous temperature cycling.

In addition, CGA package 100 includes capacitors 150 on the bottom side of substrate 101. Preferably, capacitors 150 are two-tab cylindrical capacitors that match the height of solder columns 120. Like solder columns 120, capacitors 150 should be able to flex during thermal expansion when exposed to continuous temperature cycling. For better compliancy, capacitors 150 should preferably be located towards the center of CGA package 100 (instead of located around the parameter as shown in FIG. 2). Although two-tab cylindrical capacitors are utilized in FIG. 2, it is understood by those skilled in the art that other shapes of two-tab capacitors are also applicable for the present invention. While the preferred geometry of the two-tab capacitors is cylindrical having a circular cross-section, other geometries, such as a rectangular block having a rectangular (or square) cross-section, are also acceptable.

When standard two-tab capacitors that match the height of solder columns 120 cannot be found, the height of solder columns 120 can be reduced or lengthened to match the height of the standard two-tab capacitors. However, when the height differential between standard two-tab capacitors and solder columns 120 are too high, or it is simply not advantageous to modify the height of solder columns 120, a reduced-height solder column can be joined to an end of a standard two-tab capacitor to provide height matching.

Figure 3:
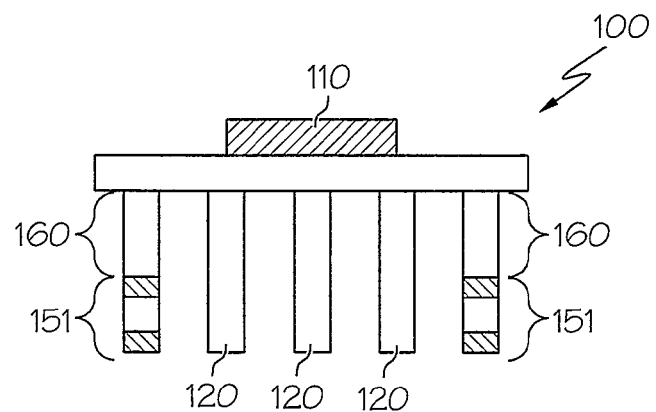
FIG. 3 is a diagram of a side view of the column grid array package from FIG. 1, in accordance with an alternative embodiment of the present invention.

Referring now to FIG. 3, there is illustrated a side view of CGA package 100, in accordance with an alternative embodiment of the present invention. As shown, CGA package 100 includes an IC chip 110 located on the top side of substrate 101, and multiple solder columns 120 located on the bottom side of substrate 101. Solder columns 120 vary from 0.050 inch to 0.100 inch in height.

In addition, CGA package 100 includes capacitors 151 on the bottom side of substrate 101. Each of capacitors 151 is connected to a reduced-height solder column 160 that is also connected to the bottom side of substrate 101. Preferably, capacitors 151 are two-tab cylindrical capacitors. Although two-tab cylindrical capacitors are utilized in FIG. 3, it is understood by those skilled in the art that other shapes of two-tab capacitors are also applicable for the present invention.

Figure 4:
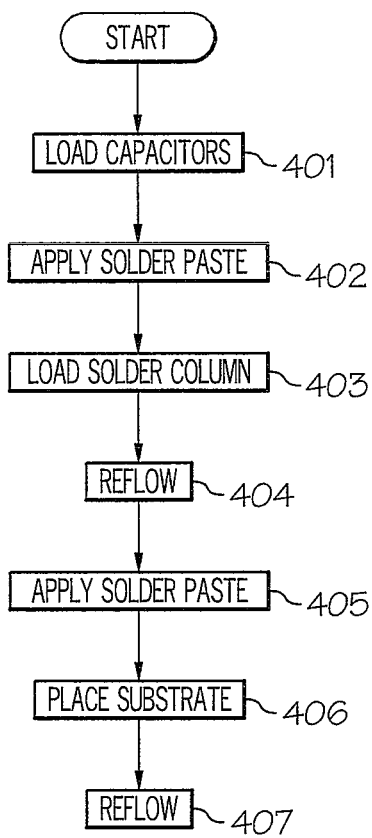
FIG. 4 is a high-level flow diagram of a method for fabricating solder columns for column grid array packages.

With reference now to FIG. 4, there is illustrated a method for fabricating solder columns for CGA packages, in accordance with a preferred embodiment of the present invention. Initially, two-tab capacitors are loaded using a first loading template having holes large enough to fit the two-tab capacitors, as shown in block 401. Solder paste is then applied to the top surface of the two-tab capacitors, as depicted in block 402. Next, the solder columns are loaded, as shown in block 403. Solder is reflowed, as depicted in block 404. Solder paste is then applied to the top surface of the solder columns, as shown in block 405. A substrate or an interposer is loaded on top the two-tab capacitors and solder columns, as depicted in block 406. Finally, the solder is reflowed to join the substrate to the two-tab capacitors and the solder columns to complete the assembly, as shown in block 407.

As has been described, the present invention provides an improved method for fabricating solder columns of a CGA package. CGA packages of the present invention have high packaging density with minimal inductance. Although two-tab capacitors are utilized to illustrate the present invention, it is understand that by those skilled in the art that the present invention is also applicable for any two-tab electronic device.

While the invention has been particularly shown and described with reference to a preferred embodiment, it will be understood by those skilled in the art that various changes in form and detail may be made therein without departing from the spirit and scope of the invention.

What is claimed is:

1. A column grid array (CGA) package comprising:
a substrate;
an integrated circuit located on a first side of said substrate;
a plurality of solder columns each having a longitudinal axis, wherein each of said plurality of solder columns is connected to a second side of said substrate at one end of its longitudinal axis; and
a plurality of two-tab electronic devices each having a longitudinal axis, wherein each of said plurality of two-tab electronic devices is connected to said second side of said substrate at one end of its longitudinal axis such that the longitudinal axes of said plurality of two-tab electronic devices are parallel with the longitudinal axes of said solder columns, wherein heights of said two-tab electronic devices are substantially identical to heights of said solder columns.

2. The CGA package of claim 1, wherein the heights of said solder columns range from 0.05 inch to 0.10 inch.

3. The CGA package of claim 1, wherein said two-tab electronic devices are two-tab capacitors.

4. The CGA package of claim 1, wherein a cross-section of one of said two-tab electronic devices has a circular shape.

5. The CGA package of claim 1, wherein a cross-section of one of said two-tab electronic devices has a rectangular shape.

6. A column grid array (CGA) package comprising:
a substrate;
an integrated circuit located on a first side of said substrate;
a plurality of solder columns each having a longitudinal axis, wherein each of said plurality of solder columns is connected to a second side of said substrate at one end of its longitudinal axis;
a plurality of reduced-height solder columns each having a longitudinal axis, wherein each of said plurality of reduced-height solder columns is connected to a second side of said substrate at a first end of its longitudinal axis; and
a plurality of two-tab electronic devices each connected to a respective one of said reduced-height solder columns at a second end of its longitudinal axis, wherein a combined height of one of said two-tab electronic devices and one of said reduced-height solder columns is substantially identical to a height of one of said solder columns.

7. The CGA package of claim 6, wherein the heights of said solder columns range from 0.05 inch to 0.10 inch.

8. The CGA package of claim 6, wherein said two-tab electronic devices are two-tab capacitors.

9. The CGA package of claim 6, wherein a cross-section of one of said two-tab electronic devices has a circular shape.

10. The CGA package of claim 6, wherein a cross-section of one of said two-tab electronic devices has a rectangular shape.

11. The CGA package of claim 6, wherein each of said plurality of solder columns' longitudinal axis is along its height.

12. The CGA package of claim 11, wherein each of said plurality of reduced-height solder columns' longitudinal axis is along its height.

13. The CGA package of claim 12, wherein each of said plurality of two-tab electronic devices has a longitudinal axis that is located along its height.

14. The CGA package of claim 12, wherein each of said plurality of two-tab electronic devices is connected to a respective one of said reduced-height solder columns along their longitudinal axes.

15. The CGA package of claim 1, wherein each of said plurality of solder columns' longitudinal axis is along its height.

16. The CGA package of claim 13, wherein each of said plurality of two-tab electronic devices' longitudinal axis is along its height.

* * * * *